United States Patent
Jensen et al.

(10) Patent No.: US 6,941,116 B2
(45) Date of Patent: Sep. 6, 2005

(54) LINEARIZATION TECHNIQUE FOR PHASE LOCKED LOOPS EMPLOYING DIFFERENTIAL CHARGE PUMP CIRCUITRY

(75) Inventors: Henrik T. Jensen, Long Beach, CA (US); Michael Kappes, San Diego, CA (US)

(73) Assignee: Broadcom Corp., Irvine, CA (US)

( * ) Notice: Subject to any disclaimer, the term of this patent is extended or adjusted under 35 U.S.C. 154(b) by 476 days.

(21) Appl. No.: 10/306,040

(22) Filed: Nov. 27, 2002

(65) Prior Publication Data

US 2004/0102170 A1 May 27, 2004

(51) Int. Cl.[7] .................... H04B 1/40; H04B 7/00; H03D 3/24
(52) U.S. Cl. .................. 455/76; 455/118; 455/260; 375/374; 327/157
(58) Field of Search .................. 455/76, 112, 118, 455/260, 264, 265, 313; 375/373, 374, 375, 376; 327/156, 157; 331/177 R

(56) References Cited

U.S. PATENT DOCUMENTS

| | | | | |
|---|---|---|---|---|
| 5,315,270 | A | * | 5/1994 | Leonowich ............. 331/1 A |
| 6,181,210 | B1 | * | 1/2001 | Wakayama ............. 331/8 |
| 6,442,225 | B1 | * | 8/2002 | Huang ............. 375/376 |
| 6,487,398 | B1 | | 11/2002 | Kovac et al. |

FOREIGN PATENT DOCUMENTS

| EP | 0 405 523 A | 1/1991 |
|---|---|---|
| EP | 0 449 659 B | 9/1995 |
| JP | 02 021724 A | 1/1990 |
| WO | WO 01 91229 A | 11/2001 |

OTHER PUBLICATIONS

Orcioni S et al: "An 800 MHz 0.35/spl mu/m CMOS clock tree and PLL based on a new charge–pump circuit" 9TH International Conference on Electronics, Circuits and Systems, vol. 2, Sep. 15–18, 2002, pp. 571–574, XP010614413; p. 572, paragraph 2—p. 573, paragraph 1; figures 3–6.

* cited by examiner

Primary Examiner—Nguyen T. Vo
(74) Attorney, Agent, or Firm—Garlick, Harrison & Markison, LLP; Timothy W. Markison

(57) ABSTRACT

A differential linear fractional N-synthesizer includes a phase and frequency detection module, a linearized charge pump, a low pass filter, a voltage controlled oscillator, and a fractional N divider feedback. The phase and frequency detection module is operably coupled to produce a differential charge-up signal, a differential charge-down signal, or a differential off signal based on phase and/or frequency differences between a reference oscillation and a feedback oscillation. The feedback oscillation is generated by the fractional N divider feedback, which divides an output oscillation by a divider value to produce the feedback oscillation. The linearized charge pump includes a $1^{st}$ current source, a $2^{nd}$ current source and a modulation module. In response to the differential off signal, the modulation module produces a modulated differential off signal that causes the $1^{st}$ and $2^{nd}$ current sources to produce a zero current signal in an alternating fashion. The low pass filter is operably coupled to attenuate the high frequency signal components produced by the modulation module of the linearized charge pump and to pass the positive, negative or zero current signals to produce a filtered signal. The voltage control oscillator produces the output oscillation based on the filtered signal.

34 Claims, 11 Drawing Sheets local oscillation module 74 matching module 156

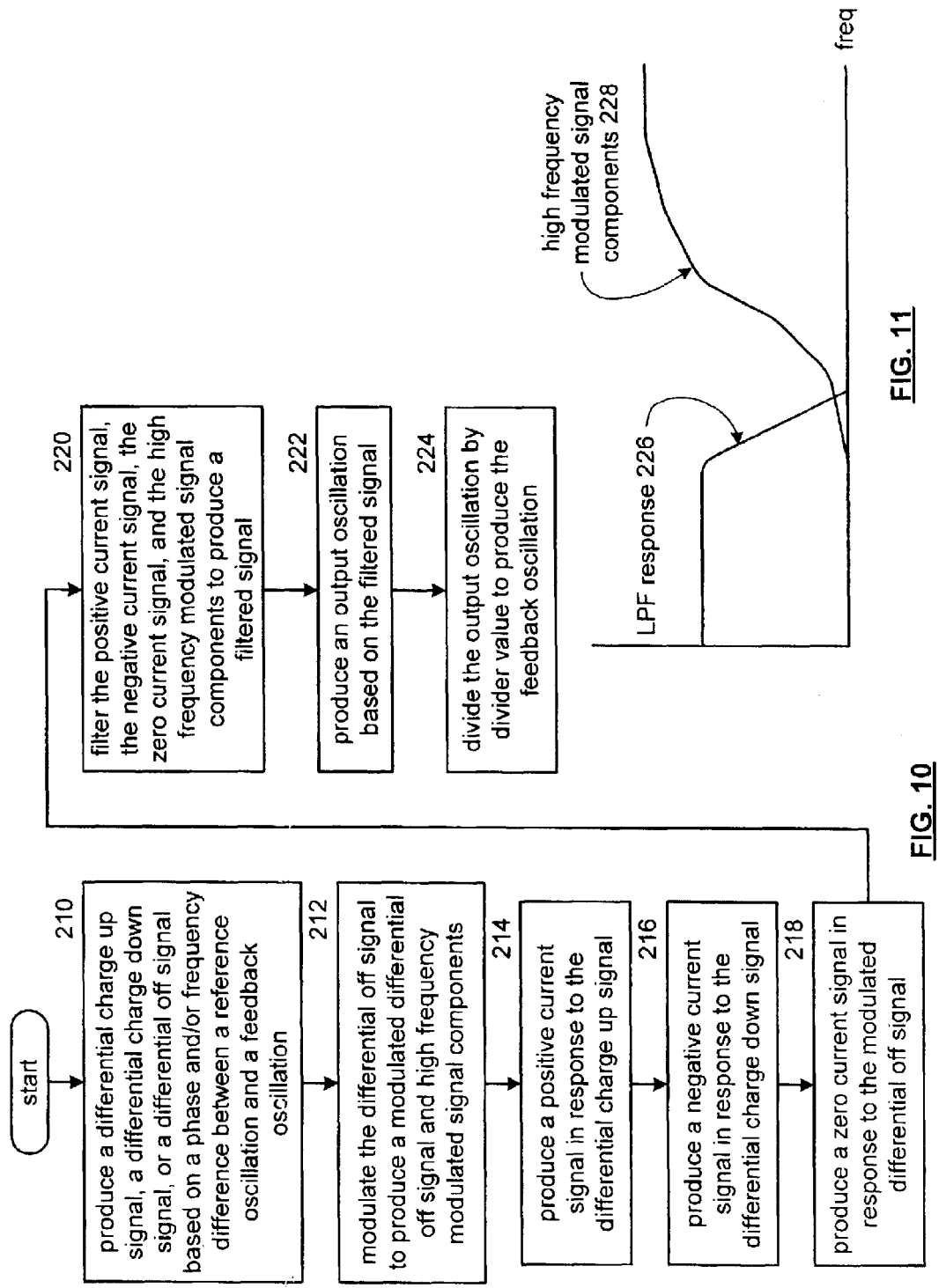

transmitter 235

RF power spectrum resulting from operation of transmitter 235 without linearized charge pump RF power spectrum resulting from operation of transmitter 235 with linearized charge pump

LINEARIZATION TECHNIQUE FOR PHASE LOCKED LOOPS EMPLOYING DIFFERENTIAL CHARGE PUMP CIRCUITRY

TECHNICAL FIELD OF THE INVENTION

This invention relates generally to wireless communication systems and more particularly to radio frequency integrated circuits used in such wireless communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. The filtering stage filters the baseband signal or the IF signal to attenuate unwanted out of band signals to produce a filtered signal. The data recovery stage recovers raw data from the filtered signal in accordance with the particular wireless communication standard.

The local oscillations used in both the transmitter and receiver may be produced by the same or different local oscillation generators. In either case, a local oscillator generator is typically implemented using a fractional N-synthesizer. As is known, a fractional N-synthesizer has a phase lock loop (PLL) topology that allows for fractional adjustments of the feedback oscillation via a feedback fractional N divider. As is also known, the fractional adjustments of the fractional N divider, allow for fine tuning of the local oscillation such that, for example, a particular channel may be tuned, a particular intermediate frequency may be achieved, et cetera.

While the PLL is readily used in RF transceiver architectures, its accuracy is limited by the linearity of the components comprising the phase locked loop. As is known, a phase locked loop typically includes a phase/frequency detector, a charge pump, a low pass filter, a voltage controlled oscillator, and a divider, which may be a fractional-N divider. In most PLLs, the charge pump is a tri-state device providing a positive current when the output frequency and/or phase is too low, a negative current when the output frequency and/or phase is too high and zero current at all other times. To produce the zero current state, the charge pump activates its two current sources to provide equal, but opposite, currents to the low pass filter. In an ideal environment, the net current provided by the charge pump during the zero current state is exactly zero. In practice, however, the currents produced by each current source of the charge pump are not identical due to integrated circuit manufacturing process variations, temperature variations, etc.

The difference in currents during the off current state of the charge pump results in a non-net zero current being provided to the low pass filter, which results in unwanted spurs in the output oscillation. For example, a translational loop transmitter configured in accordance with the GSM cellular telephony standard includes a baseband modulator, a crystal reference, a phase-and-frequency detector (PFD), a charge pump (CP), a low pass filter (LPF), a voltage controlled oscillator (VCO), a local oscillator (OSC), and two sets of mixers. The phase modulated baseband data is generated in Cartesian form by the host processor and translated to a 25 MHz intermediate frequency by a down-converted version of the transmitted signal. The PFD compares this signal against a fixed 25 MHz reference signal and generates an output proportional to the difference between this fixed reference clock and the output of the summing node. The action of the phase locked loop is to drive this difference to zero; hence, after a brief transient period, the frequency and phase of the transmitted signal equals the frequency and phase of the baseband signal. The LPF is typically chosen such that the closed loop magnitude response has a 3 dB bandwidth of 1–3 MHz. The VCO operates in the desired transmit band (TX band); for GSM this band is 880 MHz–915 MHz. For comparison, the receive band (RX band) for GSM is 925 MHz–960 MHz.

The GSM cellular telephony standard defines limitations to the tolerable level of spurious emission produced by the transmitter when in operation. In particular, emission in the RX band is critical. A problem of significance related to spurious transmission from translational loops is the non-linear operation of the CP, as previously discussed. For instance, a 2.5% mismatch between the current sources of the CP produces spurs during transmission of data that are within the RX band to a degree impermissible by the GSM standard.

As is further known, phase locked loops are used in a variety of applications in radio transceivers, audio equipment, video equipment, etc. In each of the various PLL applications, the above mentioned non-linearities are present and may adversely affect the performance of the electronic equipment incorporating the PLL.

One known effort to combat the current mismatch produced by the charge pump is to use matched components to create the current sources of the charge pump. While this mitigates the problem, it does not reduce it sufficiently enough for today's high performance radio frequency integrated circuit applications, including GSM radios, and other advanced technology applications.

Therefore, a need exists for a highly linear charge pump for use in phase locked loops, where such phase locked loops may be used in radio frequency integrated circuits and other advanced technology applications.

SUMMARY OF THE INVENTION

The linearized charge pump circuitry of the present invention substantially meets these needs and others. In one embodiment, a phase locked loop includes a phase and frequency detection module, a linearized charge pump, a low pass filter, a voltage controlled oscillator, and a divider module. The phase and frequency detection module is operably coupled to produce a differential charge-up signal, a differential charge-down signal, or a differential off signal based on phase and/or frequency differences between a reference oscillation and a feedback oscillation. The divider module generates the feedback oscillation by dividing the output oscillation of the PLL by a divider value, which may be whole number or integer.

The linearized charge pump includes a $1^{st}$ current source, a $2^{nd}$ current source and a modulation module. When the linearized charge pump receives the differential charge-up signal, the $1^{st}$ and $2^{nd}$ current sources, in combination, produce a positive current signal, which is provided to the low pass filter. In response to the differential charge-down signal, the $1^{st}$ and $2^{nd}$ current sources collectively produce a negative current signal, which is provided to the low pass filter. In response to the differential off signal, the modulation module produces a modulated differential off signal that causes the $1^{st}$ and $2^{nd}$ current sources to produce a zero current signal in an alternating fashion. By modulating the generation of the zero current signal at a frequency higher than the corner frequency of the low pass filter, the tri-state output of the charge pump is linearized. As such, the net effect is a linearized charge pump over its three operating states.

The low pass filter is operably coupled to attenuate the high frequency signal components produced by the modulation module of the linearized charge pump and to pass the positive, negative or zero current signals to produce a filtered signal. The voltage control oscillator produces the output oscillation based on the filtered signal.

The linearized charge pump may be used in any phase lock loop applications with differential loop filter circuitry to produce highly linear output oscillations. In addition, the PLL incorporating the linearized charge pump may be used in radio frequency integrated circuit applications to provide highly linear local oscillations for up-converting baseband signals to radio frequency signals and for down-converting radio frequencies into baseband signals.

BRIEF DESCRIPTION OF THE DRAWINGS

FIG. 10 is a logic diagram illustrating a method for differential linear fractional N synthesis in accordance with the present invention;

FIG. 11 is a graph representing the frequency response of the low pass filter and the frequency response of the high frequency modulated signal components in accordance with the present invention;

DETAIL DESCRIPTION OF A PREFERRED EMBODIMENT

Figure 1:
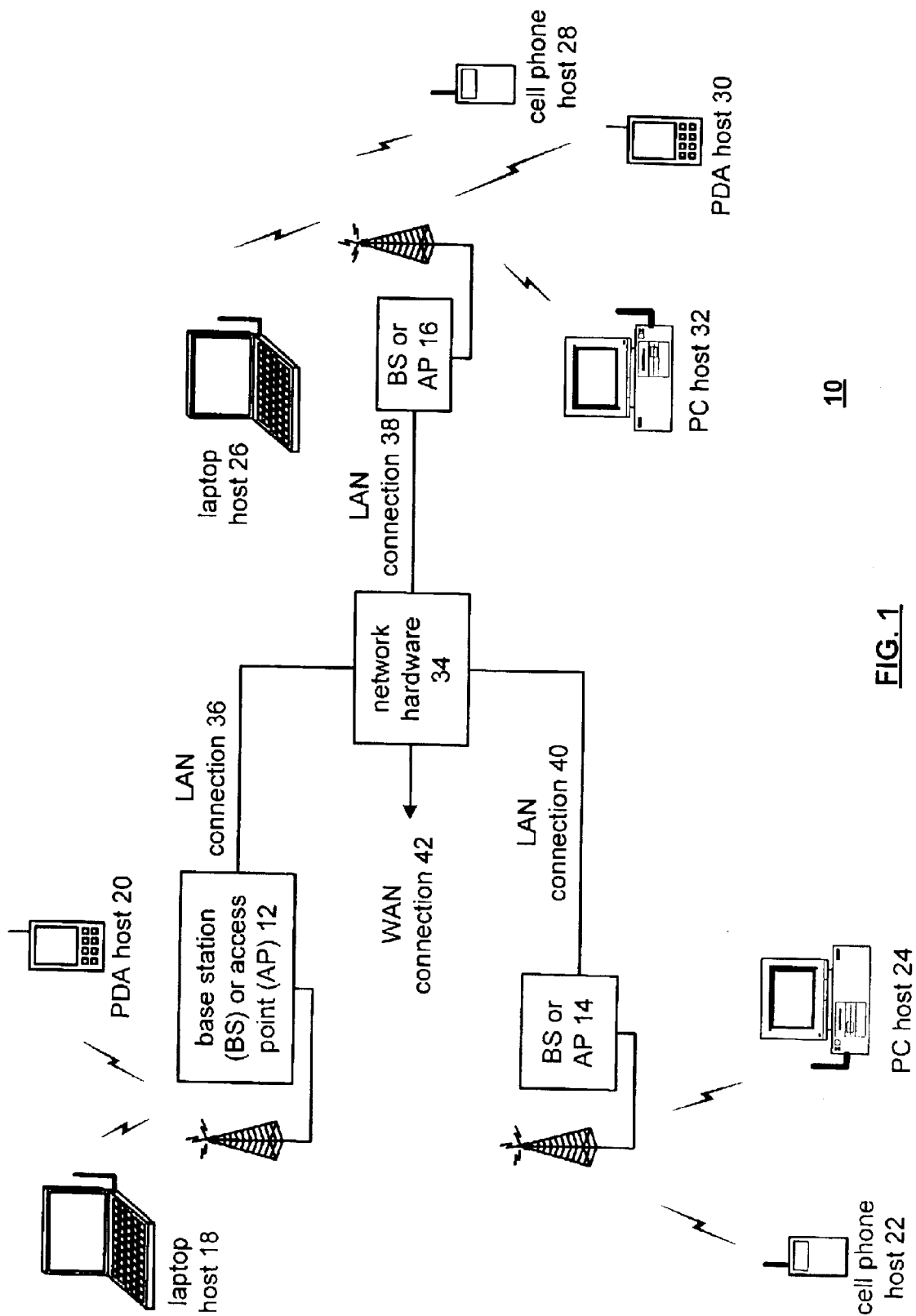
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
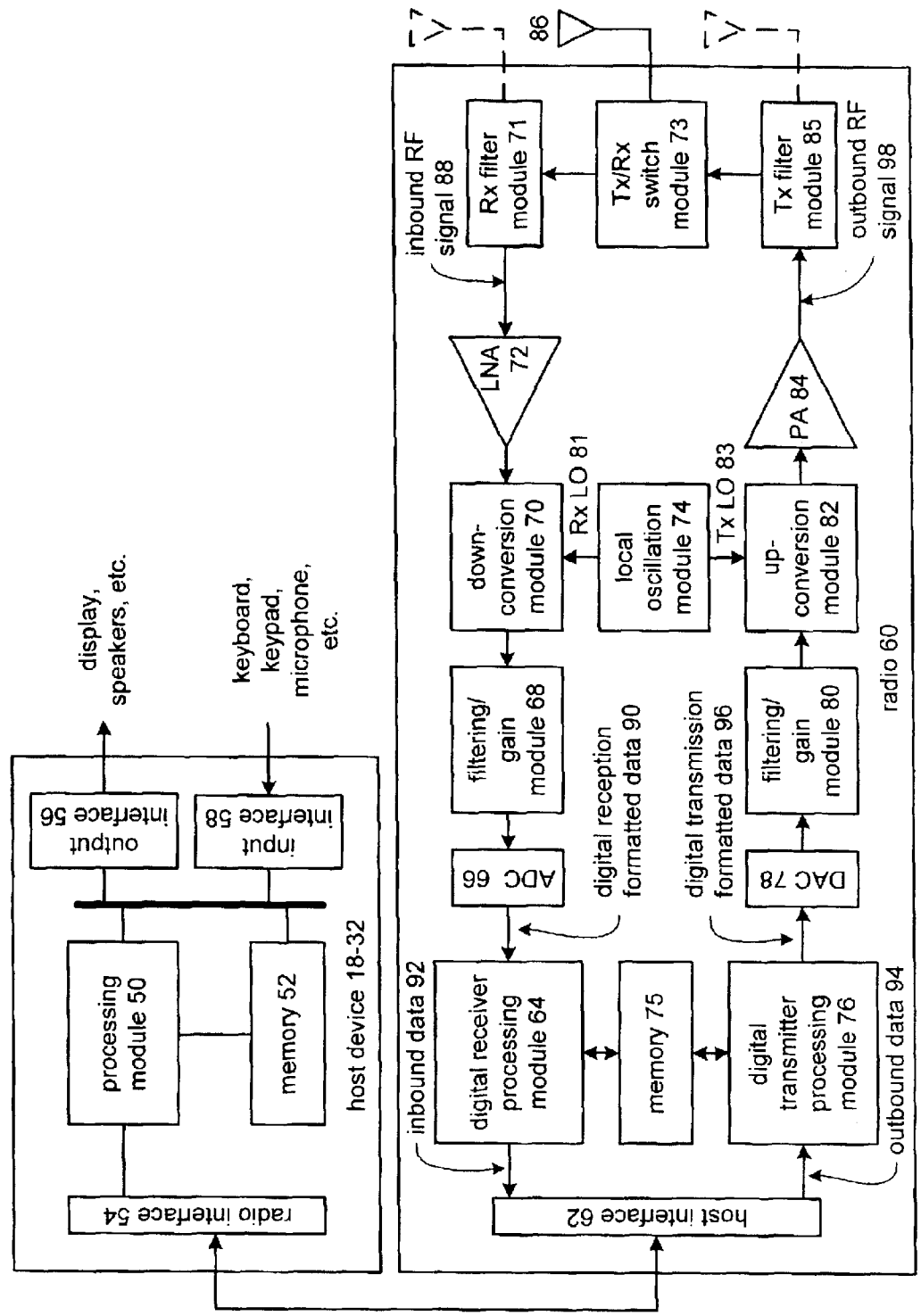
FIG. 2 is a schematic block diagram illustrating a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–12.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/attenuation module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
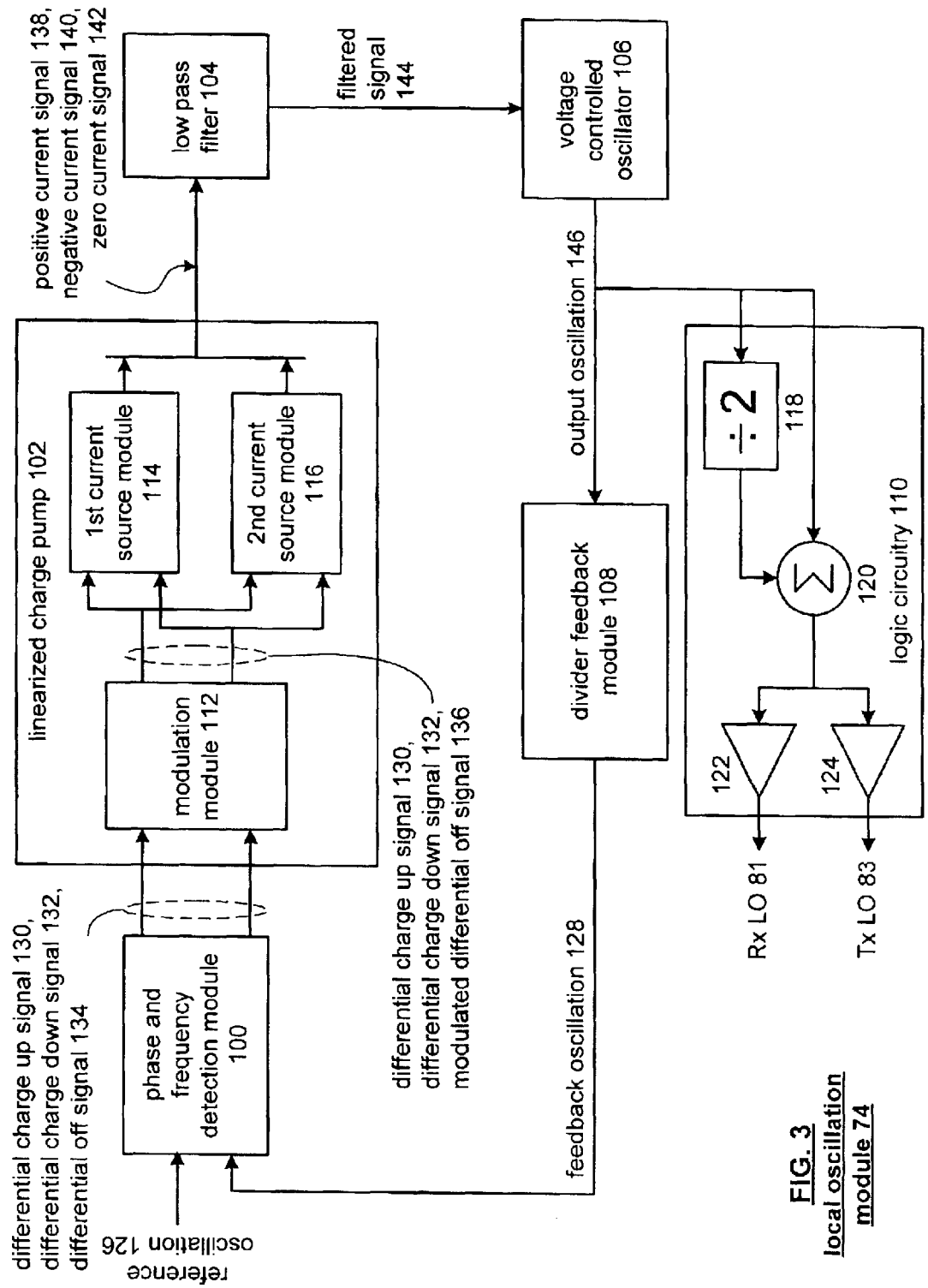
FIG. 3 is a schematic block diagram illustrating a local oscillation module in accordance with the present invention.

FIG. 3 is a schematic block diagram illustrating the local oscillation module 74 in greater detail. The local oscillation module 74 includes a phase and frequency detection module 100, a linearized charge pump 102, low pass filter 104, voltage controlled oscillator 106, divider feedback module 108 and may also include logic circuitry 110. The linearized charge pump 102 includes a modulation module 112, a $1^{st}$ current source module 114, and a $2^{nd}$ current source module 116. The logic circuitry 110 includes a divide by 2 module 118, a summing module 120 and output buffers 122 and 124. In general, the logic circuitry 110 takes the output oscillation 146 divides it by 2 and sums the divided by 2 value with the output oscillation to produce the receive local oscillation 81 and transmit local oscillation 83. As such, the output oscillation 146 is ⅔rds the desired local oscillation 81 and 83. As one of average skill in the art will appreciate, to produce an in-phase and quadrature component for the receive local oscillation 81 and transmit local oscillation 83, the output oscillation 146 would be phase shifted by 90° and similar circuitry to that shown for logic circuitry 110 would be added to produce the quadrature components from the 90° phase shifted output oscillation.

In operation, the phase and frequency detection module 100 compares a reference oscillation 126 with a feedback oscillation 128. A crystal generator or some other clock source may produce the reference oscillation 126. The phase and frequency detection module 100, which will be described in greater detail with reference to FIG. 4, generates a differential charge-up signal 130 when the phase and/or frequency of the reference oscillation 126 leads the feedback oscillation 128 (which corresponds to the output oscillation 146 being to slow). The phase and frequency detection module 100 creates a differential charge-down signal when the phase and/or frequency of the feedback oscillation 128 leads the reference oscillation 126, (which corresponds to the output oscillation 146 being too fast).

The phase and frequency detection module 100 produces the differential off signal 134 at all other times. In general, the differential charge-up signal 130 and the differential charge-down signal 132 are active a relatively short period of time in comparison with the differential off signal 134. This will be further illustrated and discussed with reference to FIGS. 4 and 5.

The modulation module 112 is operably coupled to receive the differential charge-up signal 130, the differential charge-down signal 132 and the differential off signal 134. The modulation module 112 passes the differential charge-up signal 130 and also passes the differential charge-down signal 132 without modification. The modulation module 112, however, modulates the differential off signal 134 to produce a, modulated differential off signal 136. The rate of modulation performed by modulation module 112 is at a rate sufficiently greater than the corner frequency of the low pass filter 104 such that the high frequency components generated by the modulation module 112 during the modulation of the differential off signal 134 are substantially filtered by the low pass filter 104.

When the $1^{st}$ and $2^{nd}$ current source modules 114 and 116 receive the differential charge-up signal 130 and they produce therefrom a positive current signal 138. The low pass filter 104, which includes a capacitor, receives the positive current signal 138 and produces a filtered signal 144 therefrom. In essence, the positive current signal charges the capacitor thereby increasing the magnitude of the filtered signal 144. The increased magnitude causes the voltage control oscillator 106 to increase the rate of oscillation of the output oscillation 146.

When the $1^{st}$ and $2^{nd}$ current source modules 114 and 116 receive the differential charge-down signal 132 and they produce a negative current signal 140. The low pass filter 104 filters the negative current signal 140 to produce the filtered signal 144 having a reduced magnitude. In essence, the negative current signal 140 is removing energy from the capacitor of the low pass filter 104, thereby reduced the magnitude of the filtered signal 144. The lower magnitude of the filtered signal causes the voltage control oscillator 106 to reduce the rate of oscillation of the output oscillation 146.

When the $1^{st}$ and $2^{nd}$ current source modules 114 and 116 receive the modulated differential off signal 136 they produce the zero current signal 142 in an alternating manner. The low pass filter 104 filters the zero current signal 142 to produce the filtered signal 144 such that the magnitude of the filtered signal 144 is unchanged. Since the filtered signal 144 is unchanged, the voltage control oscillator 106 continues to produce the output oscillation 146 at the same rate of oscillation. Because the differential off signal is modulated, the resulting zero current signal 142 is linear with respect to the positive current signal 138 and negative current signal 140. The linearization of the zero current signal will be discussed in greater detail with reference to FIGS. 4–8.

The divider module 108 is operably coupled to receive the output oscillation 146 and, via a divider value, divide the output oscillation 146 to produce the feedback oscillation 128. The divider value includes an integer portion and a fractional portion for fractional-N synthesis, or another value for PLL operation, to obtain the desired output oscillation from the reference oscillation. As one of average skill in the art will appreciate, the fractional N-synthesizer or PLL may be implemented as a stand alone device, or used in other advanced technology applications such as computers, networking equipment (e.g., routers, switches, bridges, gateways, et cetera), home entertainment equipment, video processing applications, et cetera.

Figure 4:
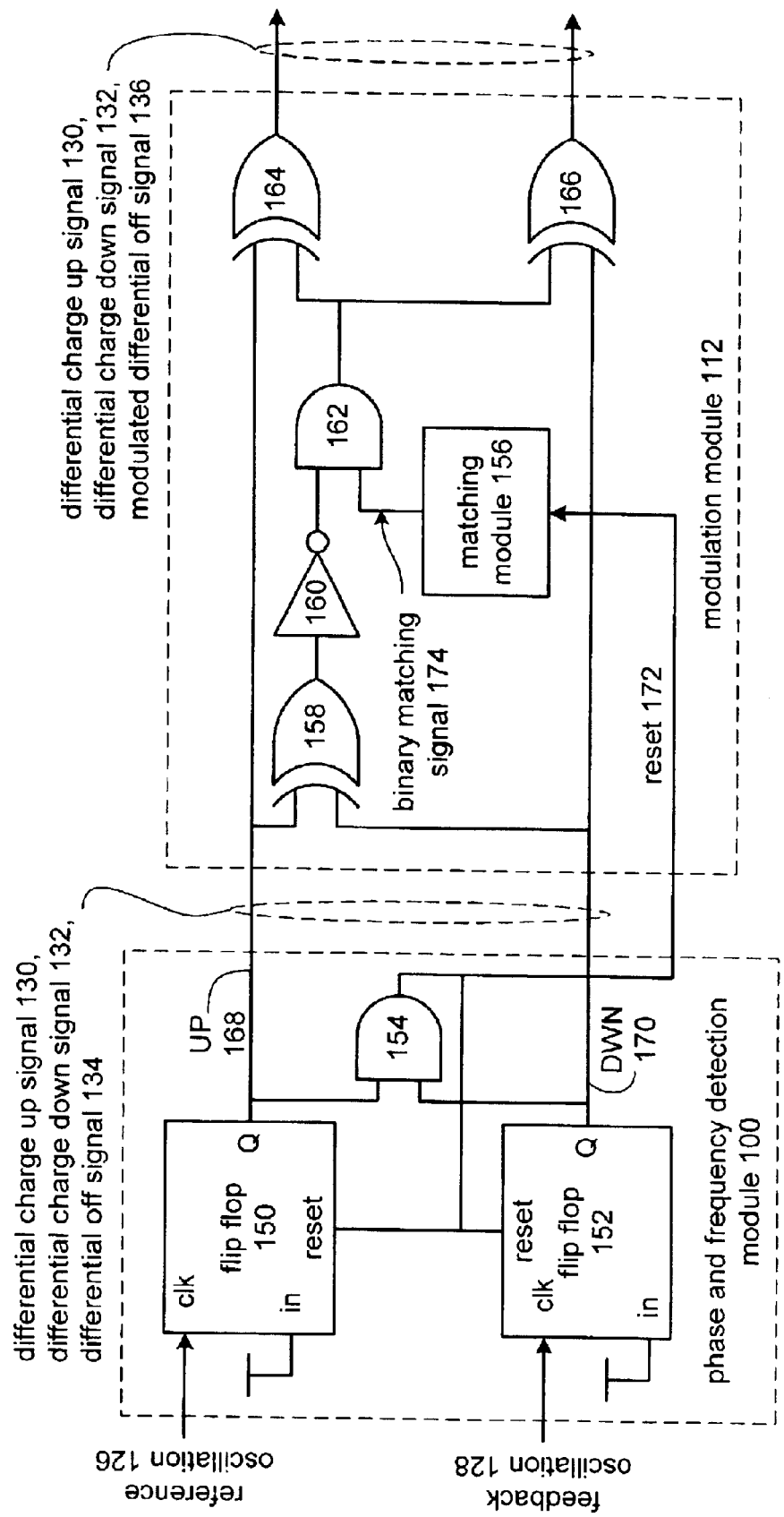
FIG. 4 is a schematic block diagram illustrating a phase and frequency detection module and modulation module of a charge pump in accordance with the present invention.
Figure 5:
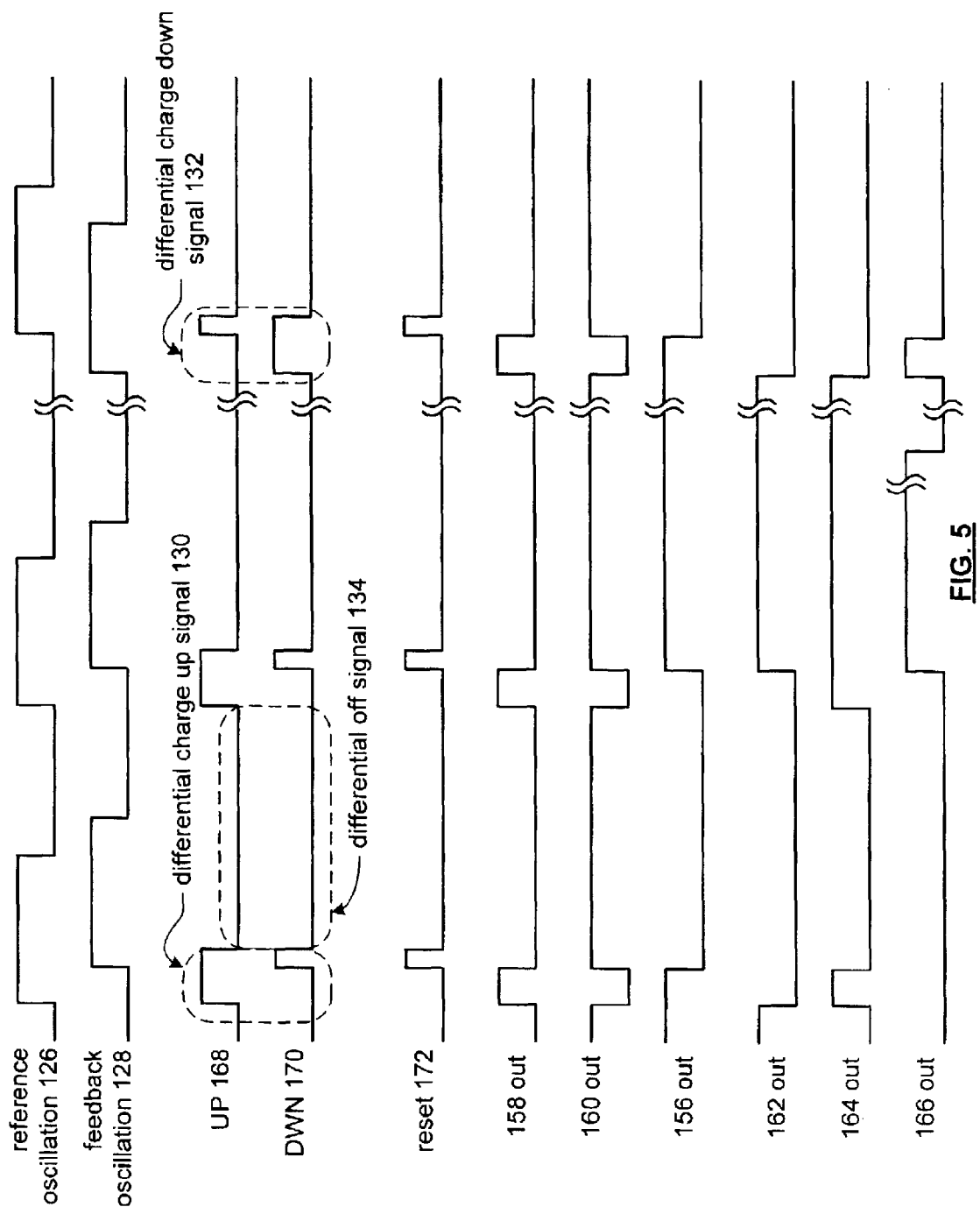
FIG. 5 is a timing diagram illustrating the signal relationships of the phase and frequency detection module and modulation module of FIG. 4.

Referring simultaneously to FIGS. 4 and 5, FIG. 4 is a schematic block diagram illustrating the phase and frequency detection module 100 and the modulation module 102 in greater detail. FIG. 5 is a timing diagram corresponding to the signals produced by the phase and frequency detection module 100 and modulation module 112. As shown in FIG. 4, the phase and frequency detection module 100 includes a 1st flip-flop 150, a $2^{nd}$ flip-flop 152 and an AND gate 154. The modulation module 112 includes a $1^{st}$ exclusive OR gate 158, an inverter 160, an AND gate 162, a matching module 156, which will be described in greater detail with reference to FIG. 9, and 2 output exclusive OR gates 164 and 166. The data inputs of the $1^{st}$ and $2^{nd}$ flip-flops 150 and 152 are coupled to a logic one state and the reset inputs of the $1^{st}$ and $2^{nd}$ flip-flops 150 are coupled to the output of AND gate 154, which produces the reset signal 172. The clock input of the $1^{st}$ flip flop 150 is coupled to receive the reference oscillation 126 and the clock input of the $2^{nd}$ flip-flop 152 is coupled to receive the feedback oscillation 128. The output of the $1^{st}$ flip-flop 150 is labeled as an UP signal 168 and the output of the $2^{nd}$ flip-flop is labeled as a DWN signal 170.

Typically, the reference oscillation 126 will either lead, lag, or match the feedback oscillation 128 resulting in the production of the differential charge up signal, 130, the differential charge down signal 132, or the differential off signal 134. Referring simultaneously to FIGS. 4 and 5, the reference oscillation 126 is shown to initially lead the feedback oscillation 128. With the reference oscillation 126 high and the feedback oscillation 128 low, the $1^{st}$ flip-flop 150 places the UP signal 168 in a logic one state. During this time, the DWN signal 170 is in a logic zero state and the phase and frequency detection module 100 is producing the differential charge up signal 130. When the feedback oscillation 128 transitions from a logic zero state to a logic one state, the $2^{nd}$ flip-flop places the DWN signal 170 in a logic one state. With both the up signal 168 and down signal 170 being in a logic one state, the output of AND gate 154 transitions to a logic one state, which resets both flip-flops, which changes the UP signal 168 and DWN signal 170 to transition to a logic zero state. Under these circumstances, the phase and frequency detection module 100 is producing the differential off signal 134.

The exclusive OR gate 158, inverter 160, AND gate 162 and matching module 156 are operably coupled to pass the differential charge up signal 130 and the differential charge down signal 132 with out modification. As is known, if one input of an exclusive OR gate is held low, the exclusive OR gate function as a non-inverting buffer. Accordingly, when the output of AND gate 162 is low, the exclusive OR gates 164 and 166 pass the UP signal 168 and the DWN signal 170. Since the differential charge up signal 130 occurs when the UP signal 168 is in a logic one state and the DWN signal is in a logic zero state, the output of exclusive OR gate 158 is high, which is inverted via the inverter 160 producing a logic zero state. With a logic zero as one of the inputs to AND gate 162, the output of the AND gate 162 is in a zero state.

As is also known, when one of the inputs of an exclusive OR gate is placed in a logic one state, the exclusive OR gate functions as an inverter. As such, when the differential off signal 134 is being produced by the phase and frequency detection module 100, the exclusive OR gate 158, inverter 160, AND gate 162, and matching module 156 toggle the input to exclusive OR gates 164 and 166 between a logic zero state and a logic one state. This toggling, or modulation, is done in accordance with the reset signal 172. As such, the rate at which the modulation is performed is substantially higher than the corner frequency of the low pass filter.

To achieve the desired modulation, the exclusive OR gate 158 exclusively OR's the up signal 168 and down signal 170. As shown in FIG. 5, the resulting output of exclusive OR gate 158 is high when the up signal 168 is high prior to down signal 170. The inverter 160 inverts the output of exclusive OR 158 to produce the signal as shown in FIG. 5.

The matching module 156 produces a binary matching signal 174 that provides a logic zero or a logic one to AND gate 162. The binary matching signal 174 may be produced using a random pattern, a fixed pattern, and may be done at the rate of the reset signal 172 or a lower rate provided that the rate is higher than the corner frequency of the low pass filter.

In the example of FIG. 5, the output of matching module 156 toggles between a high state and a low state. Initially, the output of the matching module 156 transitions from a logic one to a logic zero state during the first generation of the differential off signal 134. With the output of the matching module 156 providing a logic zero to an input of AND gate 162, the output of AND gate 162 will be a logic zero regardless of the state of the other input. Accordingly, the UP signal 168 and DWN signal 170 will pass without inversion through the exclusive OR gates 164 and 166. Accordingly, the first generation of the modulated differential off signal 136 has both the UP and DWN signals in the logic zero state.

After the next generation of the differential charge-up signal, the output of matching module 156 transitions from a low state to a high state. As such, the modulation module 156 provides a logic one to an input of AND gate 162. When the output of the inverter 160 is also a logic one, the output of AND gate 162 is a logic one. Inverter 160 produces a logic one when the UP and DWN signals 168 and 170 are in the same state, i.e., when the differential off signal 134 is being produced. As such, with the output of AND gate 162 in a logic one state, exclusive OR gates 164 and 166 function as inverters and invert the UP and DWN signals 168 and 170. As shown, the modulated differential off signal 136 includes passing the UP and DWN signals 168 and 170 without inversion when the binary matching signal 174 is in a logic zero state and inverts the UP and DWN signals 168 when the binary matching signal 174 is in a logic one state.

At some point in time, the feedback oscillation 128 will lead the reference oscillation 126. This condition is illustrated on the right portion of FIG. 5. In this instance, the DWN signal 170 transitions from a low to a high state prior to the UP signal 168 makes the same transition. This produces the differential charge-down signal 132. The functionality of the modulation module 112 is similar for allowing the differential charge-down signal 132 to pass and toggling the differential off signal 134 which occurs when the UP and DWN signals 168 and 170 are both in the logic zero state.

Figures 6, 7, 8:
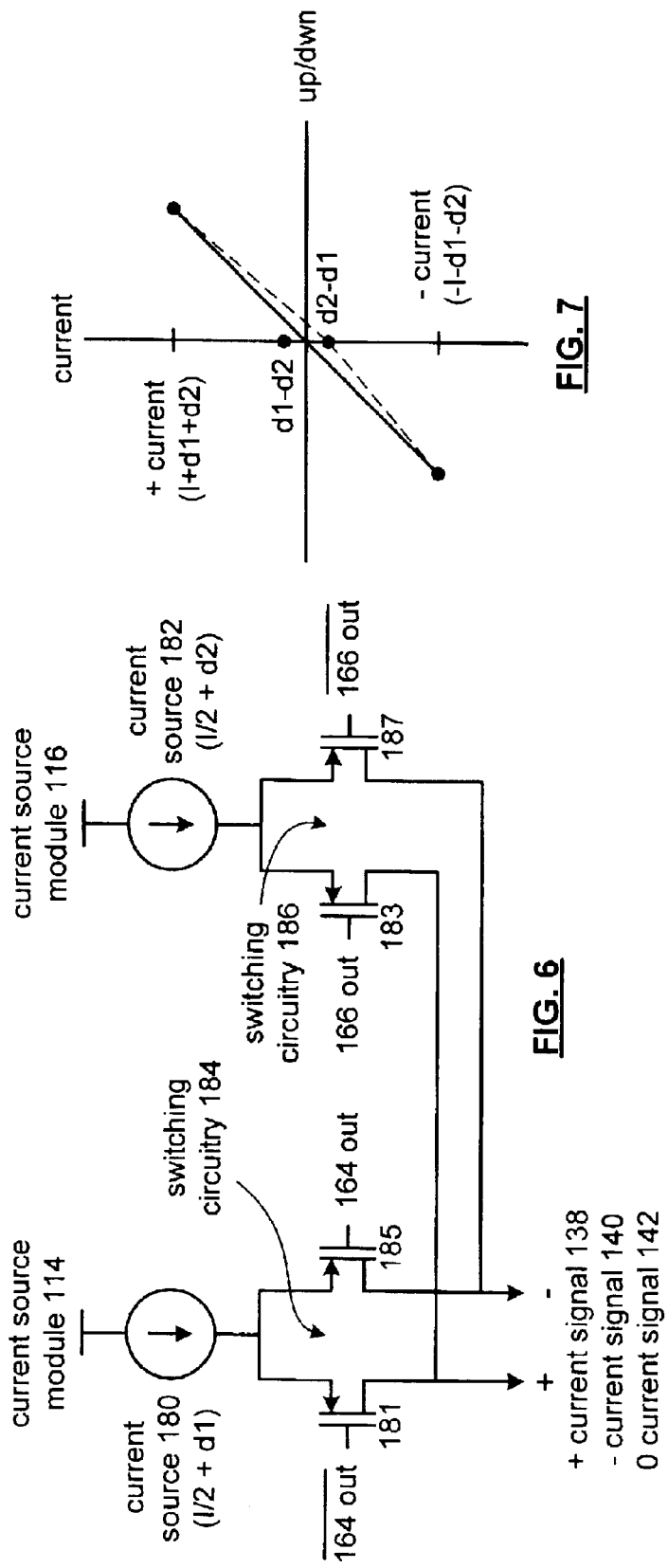
FIG. 6 is a schematic block diagram illustrating the charge pump in accordance with the present invention.
FIG. 7 is a graph representing the linearization of the charge pump of FIG. 6 in accordance with the present invention.
FIG. 8 is a timing diagram illustrating the input and output signals of the charge pump of FIG. 6.

FIG. 6 is a schematic block diagram illustrating the $1^{st}$ and $2^{nd}$ current source modules 114 and 116. The $1^{st}$ current source module 114 includes current source 180 and switching circuitry 184. The switching circuitry 184 includes two P-channel FETs (field effect transistors). The $2^{nd}$ current source module 116 includes current source 182 and switching circuitry 186, which includes two FETs. As shown, current source 180 produces a current of I/2+d1, where d1 represents the error that results from integrated circuit process variations. Current source 182 produces a current of I/2+d2, where d2 corresponds to the error in current resulting from IC process variations.

Referring to FIGS. 6, 7 and 8 simultaneously, when the differential charge-up signal 130 is being provided to the 1$^{st}$ and 2$^{nd}$ current source modules 114 and 116, the output of exclusive OR 164 is in a logic one state while the output of exclusive OR 166 is in a logic zero state. During this time, the positive current signal 138 is being generated as the sum of the current provided by current source 180 and current source 182 via transistors 181 and 183. Referring to FIG. 7, the resulting positive current is I+d1+d2.

When the differential charge-down signal is being provided to the 1$^{st}$ and 2$^{nd}$ current source modules 114 and 116, the output of exclusive OR gate 166 is in a logic one state while the output of exclusive OR gate 164 is in a logic zero state. Under these circumstances, the current source generates the negative current signal 142 as the sum of the currents produced by current source 180 and 182 via transistors 185 and 187. Referring to FIG. 7, the resulting negative current signal is—I–d1–d2.

When the modulated differential off signal 136 is provided to the current source modules 114 and 116, the zero current signal 142 is produced by alternatively activating transistors 181 and 187 and transistors 185 and 183. Thus, while on a individual basis of generating the zero current signal 142, the error currents d1 and d2 will yield a non-net zero current, by toggling back and forth between activating transistors 181 and 187 and transistors 185 and 183, the net current over time is a zero. As illustrated in FIG. 7, the solid line connecting the negative current signal and the positive current signal passes through the origin, which corresponds to the net zero current signal. Yet, on an individual basis, the offset produced by the error currents d1 and d2 produce an instantaneous non-linear effect, which is filtered out via the low pass filter resulting in a linear charge pump.

Figure 9:
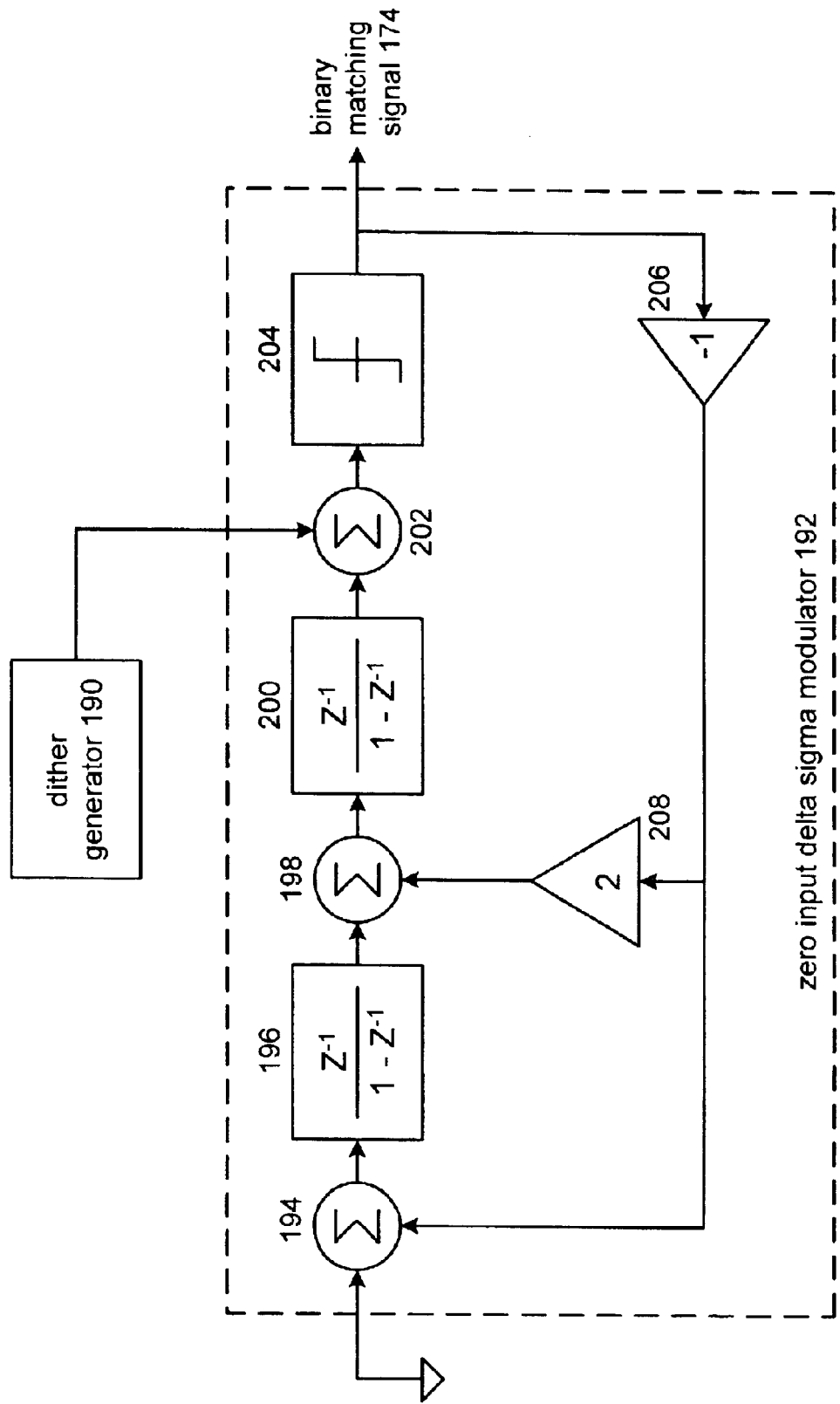
FIG. 9 is a schematic block diagram of the matching module of a charge pump in accordance with the present invention.

FIG. 9 is a schematic block diagram illustrating the matching module 156. As shown, the matching module 156 includes a dither generator 190 and a zero input Delta Sigma modulator 192. The dither generator 190 produces a random binary sequence that is injected into the zero input Delta Sigma modulator 192.

The zero input Delta Sigma modulator 192 includes a summing module 194, an integrator 196, 2$^{nd}$ summing module 198, 2$^{nd}$ integrator 200, 3$^{rd}$ summing module 202, comparator 204, 1$^{st}$ delay feedback 206 and 2$^{nd}$ delay feedback 208. In this implementation, the zero input Delta Sigma modulator 192 is a 2$^{nd}$ order Delta Sigma modulator and functions to produce the binary matching signal 174 based on the random binary data stream produced by the dither generator 190. As one of average skill in the art will appreciate, the summing module 194 may be eliminated wherein the feedback from delay feedback 206 is directly inputted to the 1$^{st}$ integrator 196. In addition, the clocking of the comparator 204 may be done at the rate of the reset signal 172 or at some other rate to provide a sufficiently high frequency such that the rate of the binary matching signal 174 is filtered out by the low pass filter.

FIG. 10 is a logic diagram illustrating a method for differential linear fractional end synthesis. The process begins at Step 210 where a differential charge-up signal, a differential charge-down signal, or a differential off signal is produced based on a phase and/or frequency difference between a reference oscillation and a feedback oscillation. These signals may be produced in accordance with the phase and frequency detection module 100 illustrated and described with reference to FIGS. 4 and 5.

The process then proceeds to Step 212 where the differential off signal is modulated to produce a modulated differential off signal and high frequency modulated signal components. The production of the modulated differential off signal may be performed in accordance with the modulation module 112 illustrated and described with reference to FIGS. 4 and 5. Since the binary matching signal 174 produced by the matching module 156 is done in accordance with a 2$^{nd}$ order Delta Sigma modulator, the quantization noise, which corresponds to the high frequency modulated signal components, is in a high frequency range. With reference to FIG. 11, if the high frequency modulated signal components 228 produced as a result of the quantization noise of the Delta Sigma modulator are above the corner frequency of the low pass filter response 226, they are filtered out with negligible effect on the overall performance of the fractional N-synthesizer. As such, the modulation between the two different states in which the zero current signal may be generated allow for a linearization of the charge pump and thus greater linearization of the fractional N-synthesizer.

Returning to the logic diagram of FIG. 10, the process proceeds to Step 214 where a positive current signal is produced in response to the differential charge-up signal. The process then proceeds to Step 216 where a negative current signal is produced in response to the differential charge-down signal. The process then proceeds to Step 218 where a zero current signal is produced in response to the modulated differential off signal. This may be done in accordance with the current sources illustrated and described with reference to FIGS. 6–8 wherein the two states in which a zero current may be generated are used in an alternate fashion to produce the net zero current.

The process then proceeds to Step 220 where the positive current signal, the negative current signal, the zero current signal and the high frequency modulated signal components are filtered to produce a filtered signal. The filtering is done in such a way that the high frequency modulated components are attenuated while the positive current signal, the negative current signal and the zero current signal are maintained. The process then proceeds to Step 222 where an output oscillation is produced based on the filtered signal. The process then proceeds to Step 224 where the output oscillation is divided by a divider value to produce the feedback oscillation. The divider value includes an integer portion and a fractional portion such that a fractional N-synthesizer is obtained.

Figure 12:
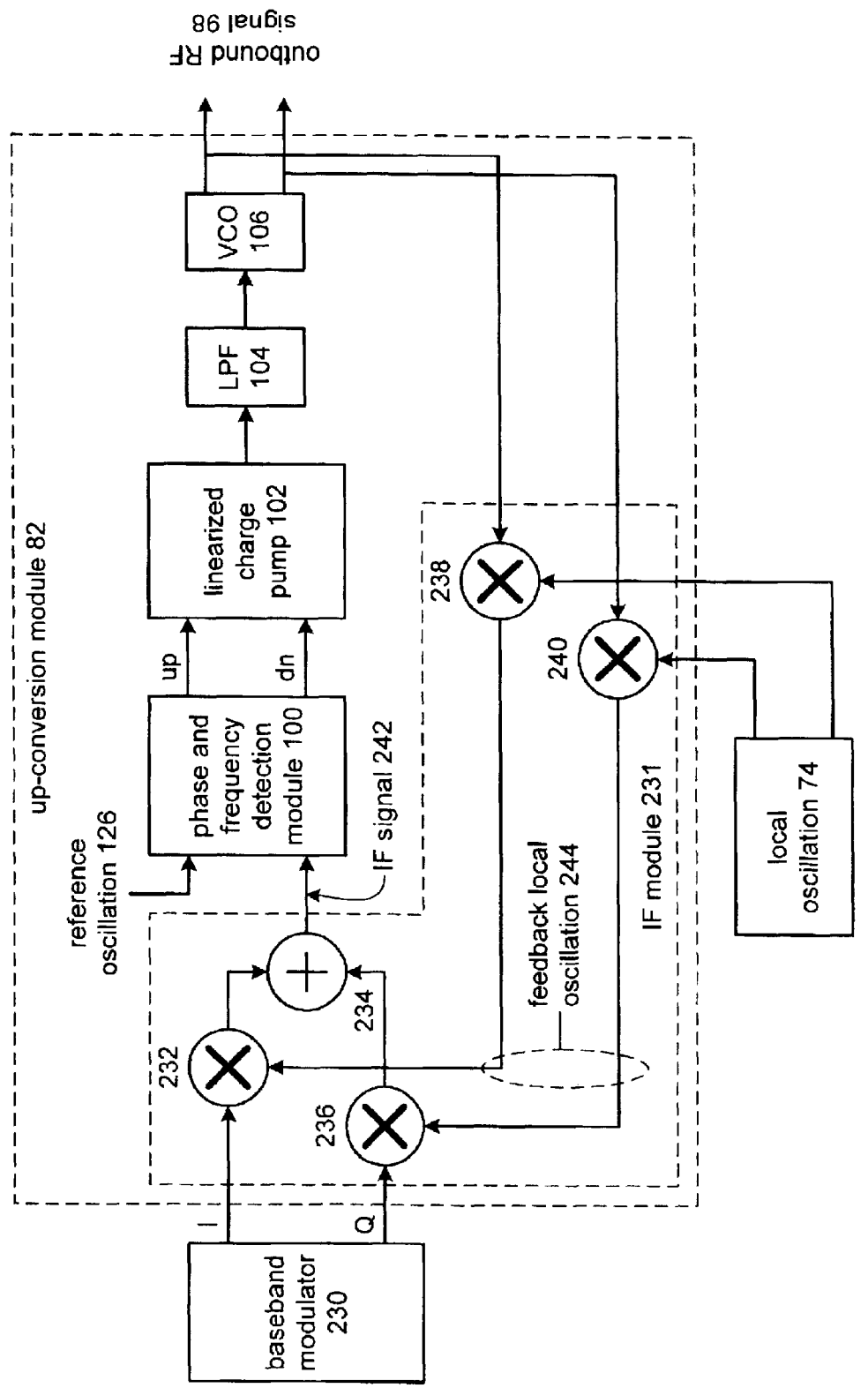
FIG. 12 is a schematic block diagram of a radio frequency transmitter in accordance with the present invention.

FIG. 12 illustrates a translation loop transmitter 235 that may be incorporated in the wireless communication device of FIG. 2. The transmitter 235 includes a baseband modulator 230 and the up-conversion module 82, which includes an intermediate frequency (IF) module 231, the phase and frequency detection module 100, the linearized charge pump 102, the low pass filter 104, and the voltage controlled oscillator 106. The IF module 231 includes mixers 232, 236, 238 and 240, and a summation module 234.

In operation, the baseband modulator 230 generates an in-phase (I) component and a quadrature (Q) component from a stream of data in accordance with one or more radio communication standards (e.g., GSM). The IF module 231 receives the I and Q components via mixers 232 and 236.

Mixer 232 mixes the I component with an in-phase component of a feedback oscillation 244 to produce a first mixed signal. Mixer 234 mixes the Q component with a quadrature component of the feedback oscillation 244 to produce a second mixed signal. The Q component of the feedback oscillation 244 is produced by mixing, via mixer 240, a quadrature component of the output RF signal 98 with a quadrature component of the TX local oscillation 83 produced by the local oscillation module 74. The I component of the feedback oscillation 244 is produced by mixing, via mixer 238, an in-phase component of the outbound RF signal 98 with an in-phase component of the TX local oscillation 83. The summation module 234 sums the first and second mixed signals to produce an IF signal 242.

The phase and frequency detection (PFD) module 100 compares the phase and/or frequency of the IF signal 242 with the phase and/or frequency of a reference oscillation 126 to produce an up signal, a down signal, or a zero signal. The PFD module 100 generates; which was described in greater detail with reference to FIG. 4, generates a differential charge-up signal when the phase and/or frequency of the reference oscillation 126 leads the IF signal 242 (which corresponds to the oscillation of the outbound RF signal 98 being to slow). The phase and frequency detection module 100 creates a differential charge-down signal when the phase and/or frequency of the IF signal 242 leads the reference oscillation 126, (which corresponds to the oscillation of the outbound RF signal 98 being too fast).

The phase and frequency detection module 100 produces the differential off signal at all other times. In general, the differential charge-up signal and the differential charge-down signal are active a relatively short period of time in comparison with the differential off signal. This was illustrated and discussed with reference to FIGS. 4 and 5.

The linearized charge pump 102 includes, as shown in FIG. 3, a modulation module 112 and two current sources 114 and 116. The modulation module 112 is operably coupled to receive the differential charge-up signal, the differential charge-down signal and the differential off signal. The modulation module 112 passes the differential charge-up signal and also passes the differential charge-down signal without modification. The modulation module 112, however, modulates the differential off signal to produce a modulated differential off signal. The rate of modulation performed by modulation module 112 is at a rate sufficiently greater than the corner frequency of the low pass filter 104 such that the high frequency components generated by the modulation module 112 during the modulation of the differential off signal are substantially filtered by the low pass filter 104.

When the $1^{st}$ and $2^{nd}$ current source modules 114 and 116 receive the differential charge-up signal and they produce therefrom a positive current signal. The low pass filter 104, which includes a capacitor, receives the positive current signal and produces a filtered signal therefrom. In essence, the positive current signal charges the capacitor thereby increasing the magnitude of the filtered signal. The increased magnitude causes the voltage control oscillator 106 to increase the rate of oscillation of the outbound RF signal 98.

When the $1^{st}$ and $2^{nd}$ current source modules 114 and 116 receive the differential charge-down signal and they produce a negative current signal 140, therefrom. The low pass filter 104 filters the negative current signal to produce the filtered signal having a reduced magnitude. In essence, the negative current signal is removing energy from the capacitor of the low pass filter 104, thereby reduced the magnitude of the filtered signal. The lower magnitude of the filtered signal causes the voltage control oscillator 106 to reduce the rate of oscillation of the outbound RF signal 98.

When the $1^{st}$ and $2^{nd}$ current source modules 114 and 116 receive the modulated differential off signal they produce the zero current signal in an alternating manner. The low pass filter 104 filters the zero current signal to produce the filtered signal such that the magnitude of the filtered signal is unchanged. Since the filtered signal is unchanged, the voltage control oscillator 106 continues to produce the outbound RF signal 98 at the same rate of oscillation. Because the differential off signal is modulated, the resulting zero current signal is linear with respect to the positive current signal 138 and negative current signal. The linearization of the zero current signal was discussed in greater detail with reference to FIGS. 4–8.

Figure 13:
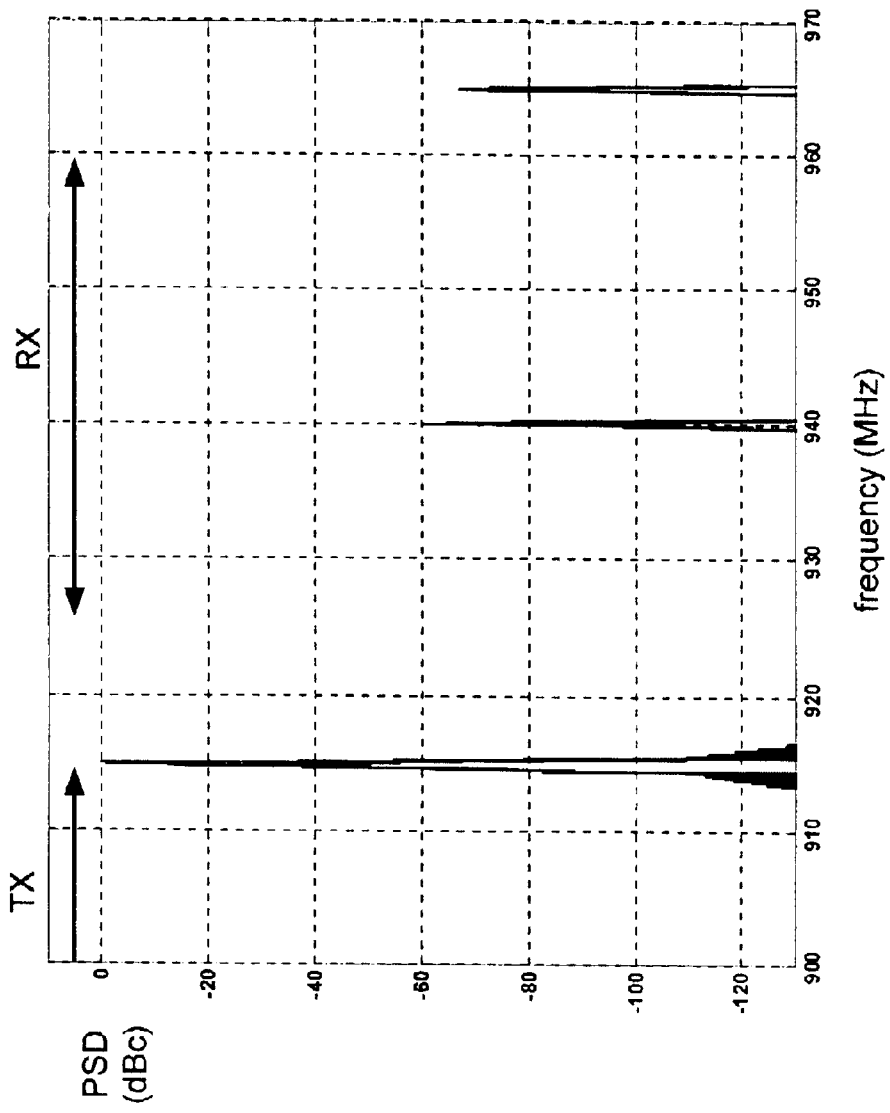
FIG. 13 is a graph of RF power spectrum resulting from operation of the transmitter of FIG. 12 without a linearized charge pump.

FIG. 13 is a graph of RF power spectrum resulting from operation of a translational loop transmitter without a linearized charge pump, with a 2.5% mismatch between the current sources of the charge pump. As shown, spurs from the transmission are generated within the RX band to a degree impermissible by the GSM standard.

Figure 14:
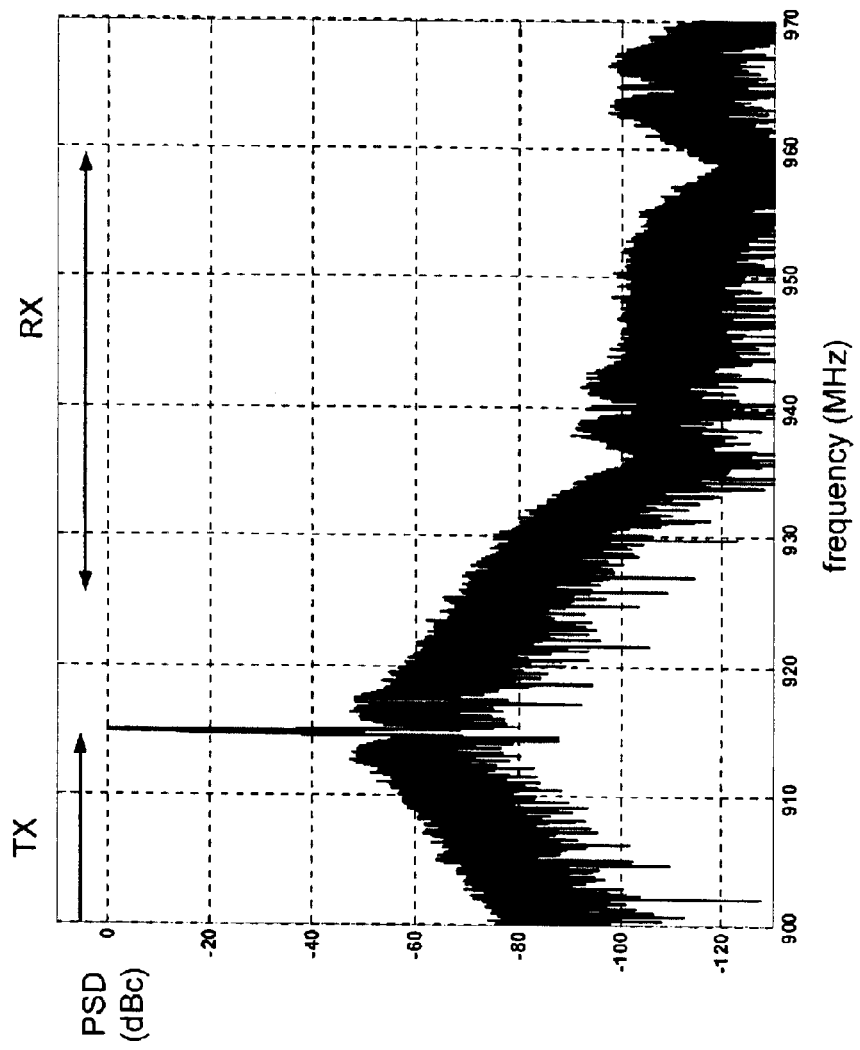
FIG. 14 is a graph of RF power spectrum resulting from operation of the transmitter of FIG. 12 with a linearized charge pump in accordance with the present invention.

FIG. 14 is a graph of RF power spectrum resulting from operation of the translational loop transmitter of FIG. 12 with a linearized charge pump of the present invention. As shown, the spurs in the RX band are strongly attenuated to a level permissible by the GSM standard.

The preceding discussion has presented a differential linear fractional N-synthesizer, linearized components thereof and applications thereof. In particular, by modulating the production of a zero current signal within a charge pump at a rate greater than the corner frequency of the low pass filter of the synthesizer, a more linear charge pump is obtained. As one of average skill in the art will appreciate, other embodiments may be derived from the teachings from the present invention, without deviating from the scope of the claims.

What is claimed is:

1. A differential linear phase locked loop comprises:

phase and frequency detection module operably coupled to produce a differential charge up signal, a differential charge down signal, or a differential off signal based on at least one of a phase difference between a reference oscillation and a feedback oscillation and a frequency difference between the reference oscillation and the feedback oscillation;

linearized charge pump operably coupled to produce a positive current signal in response to the differential charge up signal, a negative current signal in response to the differential charge down signal, and zero current signal in response to the differential off signal, wherein the linearized charge pump includes:

first current source module operably coupled to provide a first positive current in response to the differential charge up signal and to provide a first negative current in response to the differential charge down signal;

second current source module operably coupled to provide a second positive current in response to the differential charge up signal and to provide a second negative current in response to the differential charge down signal, wherein the first and second positive currents provide the positive current signal, wherein the first and second negative currents provide the negative current signal, and wherein the first current source module provides the first positive current and the second current source module provides the second negative current or the first current source module provides the first negative current and the second current source module provides the second positive current in response to a modulated differential off signal to produce the zero current signal and high frequency modulated signal components;

modulation module operably coupled to modulate the differential off signal to produce the modulated differential off signal and to pass the differential charge up signal and the differential charge down signal, wherein errors resulting from nonlinearities between the first and second current source modules are substantially contained in the high frequency modulated signal components;

low pass filter operably coupled to attenuate the high frequency modulated signal components and to pass, substantially unattenuated, the positive current signal, the negative current signal, and the zero current signal to produce a filtered signal;

voltage controlled oscillator operably coupled to produce an output oscillation based on the filtered signal; and divider module operably coupled to divide the output oscillation by divider value to produce the feedback oscillation, wherein the divider value includes at least an integer portion.

2. The differential linear fractional-N synthesizer of claim 1, wherein the phase and frequency detection module further comprises:

first flip-flop operably coupled to produce a first logic one at a transition edge of the reference oscillation, wherein the first flip-flop is reset to a logic zero based on a reset signal;

second flip-flop operably coupled to produce a second logic one at a transition edge of the feedback oscillation, wherein the second flip-flop is reset to a logic zero based on the reset signal; and AND gate operably coupled to produce the reset signal based on outputs of the first and second flip-flops, wherein, when the first flip-flop produces the first logic one prior to the second flip-flop producing the second logic one, the phase and frequency detection module is producing the differential charge up signal, when the second flip-flop produces the second logic one prior to the first flip-flop producing the first logic one, the phase and frequency detection module is producing the differential charge down signal, and when the reset signal is asserted, the phase and frequency detection module is producing the differential off signal.

3. The differential linear fractional-N synthesizer of claim 2, wherein the modulation module further comprises:

matching module operably coupled to produce a binary matching signal based on the reset signal; and logic circuitry operably coupled to produce the modulated differential off signal based on the binary matching signal and the differential off signal and to pass the differential charge up signal and the differential charge down signal.

4. The differential linear fractional-N synthesizer of claim 3, wherein the logic circuitry further comprises:

first exclusive OR gate operably coupled to exclusively OR the outputs of the first and second flip-flops of the phase and frequency detection module;

inverter operably coupled to invert an output of the first exclusive OR gate;

second AND gate operably coupled to logically AND an output of the inverter with the binary matching signal;

second exclusive OR gate operably coupled to exclusively OR the output of the first flip-flop of the phase and frequency detection module with an output of the second AND gate; and third exclusive OR gate operably coupled to exclusively OR the output of the second flip-flop of the phase and frequency detection module with the output of the second AND gate, wherein outputs of the second and third exclusive OR gates provides the differential charge up signal, the differential charge down signal, and the modulated differential off signal.

5. The differential linear fractional-N synthesizer of claim 3, wherein the matching module further comprises:

dither generator operably coupled to generate a random binary data stream at a frequency great than a corner frequency of the low pass filter; and zero input delta sigma modulator operably coupled to modulate a zero input in accordance with the random binary data stream to produce the matching binary signal.

6. The differential linear fractional-N synthesizer of claim 1, wherein each of the first and second current source modules further comprises:

current source operably coupled to produce a current; and switching circuitry response to the differential charge up signal, the differential charge down signal, and the modulated differential off signal to produce the positive, negative, or zero current signal from the current.

7. A linear charge pump comprises:

first current source module operably coupled to provide a first positive current in response to a differential charge up signal and to provide a first negative current in response to a differential charge down signal;

second current source module operably coupled to provide a second positive current in response to the differential charge up signal and a second negative current in response to the differential charge down signal, wherein the first and second positive currents provide a positive current signal, wherein the first and second negative currents provide a negative current signal, and wherein the first current source module provides the first positive current and the second current source module provides the second negative current or the first current source module provides the first negative current and the second current source module provides the second positive current in response to a modulated differential off signal to produce a zero current signal and high frequency modulated signal components; and modulation module operably coupled to modulate a differential off signal to produce the modulated differential off signal and to pass the differential charge up signal and the differential charge down signal, wherein errors resulting from nonlinearities between the first and second current source modules are substantially contained in the high frequency modulated signal components.

8. The linear charge pump of claim 7, wherein the modulation module further comprises:

matching module operably coupled to produce a binary matching signal based on a reset signal; and logic circuitry operably coupled to produce the modulated differential off signal based on the binary matching signal and the differential off signal and to pass the differential charge up signal and the differential charge down signal.

9. The linear charge pump of claim 8, wherein the logic circuitry further comprises:
   first exclusive OR gate operably coupled to exclusively OR inputs corresponding to the differential charge up signal, the differential charge down signal, and the differential off signal;
   inverter operably coupled to invert an output of the first exclusive OR gate;
   second AND gate operably coupled to logically AND an output of the inverter with the binary matching signal;
   second exclusive OR gate operably coupled to exclusively OR one of the inputs corresponding to the differential charge up signal, the differential charge down signal, and the differential off signal with an output of the second AND gate; and
   third exclusive OR gate operably coupled to exclusively OR another one of the inputs corresponding to the differential charge up signal, the differential charge down signal, and the differential off signal with the output of the second AND gate, wherein outputs of the second and third exclusive OR gates provides the differential charge up signal, the differential charge down signal, and the modulated differential off signal.

10. The linear charge pump of claim 8, wherein the matching module further comprises:
    dither generator operably coupled to generate a random binary data stream at a frequency great than a corner frequency of a low pass filter; and
    zero input delta sigma modulator operably coupled to modulate a zero input in accordance with the random binary data stream to produce the matching binary signal.

11. The linear charge pump of claim 7, wherein each of the first and second current source modules further comprises:
    current source operably coupled to produce a current; and
    switching circuitry response to the differential charge up signal, the differential charge down signal, and the modulated differential off signal to produce the positive, negative, or zero current signal from the current.

12. A method for generating an output oscillation, the method comprises:
    producing a differential charge up signal, a differential charge down signal, or a differential off signal based on at least one of a phase difference between a reference oscillation and a feedback oscillation and a frequency difference between the reference oscillation and the feedback oscillation;
    modulating the differential off signal to produce a modulated differential off signal and high frequency modulated signal components;
    producing a positive current signal in response to the differential charge up signal;
    producing a negative current signal in response to the differential charge down signal;
    producing a zero current signal in response to the modulated differential off signal;
    filtering the positive current signal, the negative current signal, the zero current signal, and the high frequency modulated signal components such that the high frequency modulated signal components are attenuated and the positive current signal, the negative current signal, and the zero current signal are filtered to produce a filtered signal;
    producing the output oscillation based on the filtered signal; and
    dividing the output oscillation by divider value to produce the feedback oscillation, wherein the divider value includes at least an integer portion.

13. The method of claim 12, wherein the producing the zero current signal further comprises:
    providing a first positive current and a second negative current to produce the zero current signal when the modulated differential off signal is in a first state; and
    providing a first negative current and a second positive current to produce the zero current signal when the modulated differential off signal is in a second state.

14. The method of claim 12, wherein the producing the differential charge up signal, the differential charge down signal, or the differential off signal further comprises:
    producing a first logic one at a transition edge of the reference oscillation;
    resetting the first logic one to a logic zero in accordance with a reset signal;
    producing a second logic one at a transition edge of the feedback oscillation;
    resetting the second logic one to a logic zero in accordance with the reset signal; and
    ANDing the first and second logic ones to produce the reset signal such that, when the first logic one is produced prior to the producing of the second logic one, the differential charge up signal is produced, when the second logic one is produced prior to the producing of the first logic one, the differential charge down signal is produced, and when the reset signal is asserted, the differential off signal is produced.

15. The method of claim 14, wherein the modulating the differential off signal further comprises:
    producing a binary matching signal based on the reset signal; and
    exclusive ORing the producing and resetting of the first and second logic ones to produce an exclusive OR resultant;
    inverting the exclusive OR resultant to produce an inverted exclusive OR resultant;
    ANDing the binary matching signal and the inverted exclusive OR resultant to produce an AND resultant;
    exclusive ORing the producing and resetting of the first logic one with the AND resultant to produce one leg of the differential charge up signal, one leg of the differential charge down signal or one leg of the modulated differential off signal; and
    exclusive ORing the producing and resetting of the second logic one with the AND resultant to produce another leg of the differential charge up signal, another leg of the differential charge down signal or another leg of the modulated differential off signal.

16. The method of claim 15, wherein the producing the binary matching signal further comprises:
    generating a random binary data stream at a frequency great than a corner frequency of the filtering; and
    delta sigma modulating a zero input in accordance with the random binary data stream to produce the matching binary signal.

17. An apparatus for generating an output oscillation, the apparatus comprises:

processing module; and memory operably coupled to the processing module, wherein the memory includes operational instructions that cause the processing module to:

produce a differential charge up signal, a differential charge down signal, or a differential off signal based on at least one of a phase difference between a reference oscillation and a feedback oscillation and a frequency difference between the reference oscillation and the feedback oscillation;

modulate the differential off signal to produce a modulated differential off signal and high frequency modulated signal components;

produce a positive current signal in response to the differential charge up signal;

produce a negative current signal in response to the differential charge down signal;

produce a zero current signal in response to the modulated differential off signal;

filter the positive current signal, the negative current signal, the zero current signal, and the high frequency modulated signal components such that the high frequency modulated signal components are attenuated and the positive current signal, the negative current signal, and the zero current signal are filtered to produce a filtered signal;

produce the output oscillation based on the filtered signal; and divide the output oscillation by divider value to produce the feedback oscillation, wherein the divider value includes at least an integer portion.

18. The apparatus of claim 17, wherein the memory further comprises operational instructions that cause the processing module to produce the zero current signal by:

providing a first positive current and a second negative current to produce the zero current signal when the modulated differential off signal is in a first state; and providing a first negative current and a second positive current to produce the zero current signal when the modulated differential off signal is in a second state.

19. The apparatus of claim 17, wherein the memory further comprises operational instructions that cause the processing module to produce the differential charge up signal, the differential charge down signal, or the differential off signal by:

producing a first logic one at a transition edge of the reference oscillation;

resetting the first logic one to a logic zero in accordance with a reset signal;

producing a second logic one at a transition edge of the feedback oscillation;

resetting the second logic one to a logic zero in accordance with the reset signal; and ANDing the first and second logic ones to produce the reset signal such that, when the first logic one is produced prior to the producing of the second logic one, the differential charge up signal is produced, when the second logic one is produced prior to the producing of the first logic one, the differential charge down signal is produced, and when the reset signal is asserted, the differential off signal is produced.

20. The apparatus of claim 19, wherein the memory further comprises operational instructions that cause the processing module to modulate the differential off signal by:

producing a binary matching signal based on the reset signal; and exclusive ORing the producing and resetting of the first and second logic ones to produce an exclusive OR resultant;

inverting the exclusive OR resultant to produce an inverted exclusive OR resultant;

ANDing the binary matching signal and the inverted exclusive OR resultant to produce an AND resultant;

exclusive ORing the producing and resetting of the first logic one with the AND resultant to produce one leg of the differential charge up signal, one leg of the differential charge down signal or one leg of the modulated differential off signal; and exclusive ORing the producing and resetting of the second logic one with the AND resultant to produce another leg of the differential charge up signal, another leg of the differential charge down signal or another leg of the modulated differential off signal.

21. The apparatus of claim 20, wherein the memory further comprises operational instructions that cause the processing module to produce the binary matching signal by:

generating a random binary data stream at a frequency great than a corner frequency of the filtering; and delta sigma modulating a zero input in accordance with the random binary data stream to produce the matching binary signal.

22. A radio comprises:

transmitter section operably coupled to receive outbound data and to produce therefrom, in accordance with at least one transmit local oscillation, outbound radio frequency (RF) signals;

receiver section operably coupled to receive inbound RF signals and to produce therefrom, in accordance with at least one receive local oscillation, inbound data; and local oscillation module operably coupled to produce the at least one transmit local oscillation and the at least one receive oscillation, wherein the local oscillation module includes:

phase and frequency detection module operably coupled to produce a differential charge up signal, a differential charge down signal, or a differential off signal based on at least one of a phase difference between a reference oscillation and a feedback oscillation and a frequency difference between the reference oscillation and the feedback oscillation;

linearized charge pump operably coupled to produce a positive current signal in response to the differential charge up signal, a negative current signal in response to the differential charge down signal, and zero current signal in response to the differential off signal, wherein the linearized charge pump includes:

first current source module operably coupled to provide a first positive current in response to the differential charge up signal and to provide a first negative current in response to the differential charge down signal;

second current source module operably coupled to provide a second positive current in response to the differential charge up signal and to provide a second negative current in response to the differential charge down signal, wherein the first and second positive currents provide the positive current signal, wherein the first and second negative currents provide the negative current signal, and wherein the first current source module provides the first positive current and the second current source module provides the second negative current or the first current source module provides the first negative current and the second current source module provides the second positive current in response to a modulated differential off signal to produce the zero current signal and high frequency modulated signal components;

modulation module operably coupled to modulate the differential off signal to produce the modulated differential off signal and to pass the differential charge up signal and the differential charge down signal, wherein errors resulting from nonlinearities between the first and second current source modules are substantially contained in the high frequency modulated signal components;

low pass filter operably coupled to attenuate the high frequency modulated signal components and to pass, substantially unattenuated, the positive current signal, the negative current signal, and the zero current signal to produce a filtered signal;

voltage controlled oscillator operably coupled to produce an output oscillation based on the filtered signal, wherein the at least one transmit local oscillation and the at least one receive local oscillation are based on the output oscillation; and divider module operably coupled to divide the output oscillation by divider value to produce the feedback oscillation, wherein the divider value includes at least an integer portion.

23. The radio of claim 22, wherein the phase and frequency detection module further comprises:

first flip-flop operably coupled to produce a first logic one at a transition edge of the reference oscillation, wherein the first flip-flop is reset to a logic zero based on a reset signal;

second flip-flop operably coupled to produce a second logic one at a transition edge of the feedback oscillation, wherein the second flip-flop is reset to a logic zero based on the reset signal; and AND gate operably coupled to produce the reset signal based on outputs of the first and second flip-flops, wherein, when the first flip-flop produces the first logic one prior to the second flip-flop producing the second logic one, the phase and frequency detection module is producing the differential charge up signal, when the second flip-flop produces the second logic one prior to the first flip-flop producing the first logic one, the phase and frequency detection module is producing the differential charge down signal, and when the reset signal is asserted, the phase and frequency detection module is producing the differential off signal.

24. The radio of claim 23, wherein the modulation module further comprises:

matching module operably coupled to produce a binary matching signal based on the reset signal; and logic circuitry operably coupled to produce the modulated differential off signal based on the binary matching signal and the differential off signal and to pass the differential charge up signal and the differential charge down signal.

25. The radio of claim 24, wherein the logic circuitry further comprises:

first exclusive OR gate operably coupled to exclusively OR the outputs of the first and second flip-flops of the phase and frequency detection module;

inverter operably coupled to invert an output of the first exclusive OR gate;

second AND gate operably coupled to logically AND an output of the inverter with the binary matching signal;

second exclusive OR gate operably coupled to exclusively OR the output of the first flip-flop of the phase and frequency detection module with an output of the second AND gate; and third exclusive OR gate operably coupled to exclusively OR the output of the second flip-flop of the phase and frequency detection module with the output of the second AND gate, wherein outputs of the second and third exclusive OR gates provides the differential charge up signal, the differential charge down signal, and the modulated differential off signal.

26. The radio of claim 24, wherein the matching module further comprises:

dither generator operably coupled to generate a random binary data stream at a frequency great than a corner frequency of the low pass filter; and zero input delta sigma modulator operably coupled to modulate a zero input in accordance with the random binary data stream to produce the matching binary signal.

27. The radio of claim 22, wherein each of the first and second current source modules further comprises:

current source operably coupled to produce a current; and switching circuitry response to the differential charge up signal, the differential charge down signal, and the modulated differential off signal to produce the positive, negative, or zero current signal from the current.

28. The radio of claim 22, wherein the local oscillation module further comprises:

logic circuitry to produce the at least one transmit local oscillation and the at least one receive local oscillation from the output oscillation.

29. A radio frequency (RF) transmitter comprises:

baseband modulator operably coupled to produce an in-phase (I) component and a quadrature (Q) component from a data stream;

intermediate frequency (IF) module operably coupled to generate an IF signal from the I and Q components based on a feedback local oscillation;

phase and frequency detection module operably coupled to produce a differential charge up signal, a differential charge down signal, or a differential off signal based on at least one of a phase difference between a reference oscillation and the IF signal and a frequency difference between the reference oscillation and the IF signal;

linearized charge pump operably coupled to produce a positive current signal in response to the differential charge up signal, a negative current signal in response to the differential charge down signal, and zero current signal in response to the differential off signal, wherein the linearized charge pump includes:

first current source module operably coupled to provide a first positive current in response to the differential charge up signal and to provide a first negative current in response to the differential charge down signal;

second current source module operably coupled to provide a second positive current in response to the differential charge up signal and to provide a second negative current in response to the differential charge down signal, wherein the first and second positive currents provide the positive current signal, wherein the first and second negative currents provide the negative current signal, and wherein the first current source module provides the first positive current and the second current source module provides the second negative current or the first current source module provides the first negative current and the second current source module provides the second positive current in response to a modulated differential off signal to produce the zero current signal and high frequency modulated signal components;

modulation module operably coupled to modulate the differential off signal to produce the modulated differential off signal and to pass the differential charge up signal and the differential charge down signal, wherein errors resulting from nonlinearities between the first and second current source modules are substantially contained in the high frequency modulated signal components;

low pass filter operably coupled to attenuate the high frequency modulated signal components and to pass, substantially unattenuated, the positive current signal, the negative current signal, and the zero current signal to produce a filtered signal;

voltage controlled oscillator operably coupled to produce an output RF signal based on the filtered signal, wherein the feedback oscillation is based on the output RF signal and a local oscillation.

30. The RF transmitter of claim 29, wherein the phase and frequency detection module further comprises:

first flip-flop operably coupled to produce a first logic one at a transition edge of the reference oscillation, wherein the first flip-flop is reset to a logic zero based on a reset signal;

second flip-flop operably coupled to produce a second logic one at a transition edge of the feedback oscillation, wherein the second flip-flop is reset to a logic zero based on the reset signal; and AND gate operably coupled to produce the reset signal based on outputs of the first and second flip-flops, wherein, when the first flip-flop produces the first logic one prior to the second flip-flop producing the second logic one, the phase and frequency detection module is producing the differential charge up signal, when the second flip-flop produces the second logic one prior to the first flip-flop producing the first logic one, the phase and frequency detection module is producing the differential charge down signal, and when the reset signal is asserted, the phase and frequency detection module is producing the differential off signal.

31. The RF transmitter of claim 30, wherein the modulation module further comprises:

matching module operably coupled to produce a binary matching signal based on the reset signal; and logic circuitry operably coupled to produce the modulated differential off signal based on the binary matching signal and the differential off signal and to pass the differential charge up signal and the differential charge down signal.

32. The RF transmitter of claim 31, wherein the logic circuitry further comprises:

first exclusive OR gate operably coupled to exclusively OR the outputs of the first and second flip-flops of the phase and frequency detection module;

inverter operably coupled to invert an output of the first exclusive OR gate;

second AND gate operably coupled to logically AND an output of the inverter with the binary matching signal;

second exclusive OR gate operably coupled to exclusively OR the output of the first flip-flop of the phase and frequency detection module with an output of the second AND gate; and third exclusive OR gate operably coupled to exclusively OR the output of the second flip-flop of the phase and frequency detection module with the output of the second AND gate, wherein outputs of the second and third exclusive OR gates provides the differential charge up signal, the differential charge down signal, and the modulated differential off signal.

33. The RF transmitter of claim 31, wherein the matching module further comprises:

dither generator operably coupled to generate a random binary data stream at a frequency great than a corner frequency of the low pass filter; and zero input delta sigma modulator operably coupled to modulate a zero input in accordance with the random binary data stream to produce the matching binary signal.

34. The RF transmitter of claim 29, wherein each of the first and second current source modules further comprises:

current source operably coupled to produce a current; and switching circuitry response to the differential charge up signal, the differential charge down signal, and the modulated differential off signal to produce the positive, negative, or zero current signal from the current.

\* \* \* \* \*